United States Patent
Chen et al.

(10) Patent No.: US 8,656,249 B2
(45) Date of Patent: Feb. 18, 2014

(54) MULTI-LEVEL LDPC LAYER DECODER

(75) Inventors: Lei Chen, Santa Clara, CA (US);
Johnson Yen, Fremont, CA (US);
Shaohua Yang, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 230 days.

(21) Appl. No.: 13/227,416

(22) Filed: Sep. 7, 2011

(65) Prior Publication Data
US 2013/0061112 A1 Mar. 7, 2013

(51) Int. Cl.
*H03M 13/00* (2006.01)

(52) U.S. Cl.
USPC .......................................... 714/758; 714/774

(58) Field of Classification Search
USPC ................................. 714/774, 758
See application file for complete search history.

(56) References Cited

U.S. PATENT DOCUMENTS

| | | | |
|---|---|---|---|
| 5,278,703 A | 1/1994 | Rub | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — M. Mujtaba K Chaudry
(74) *Attorney, Agent, or Firm* — Hamilton DeSanctis & Cha (57) ABSTRACT

Various embodiments of the present invention provide methods and apparatuses for multi-level layer decoding of non-binary LDPC codes. For example, an apparatus is disclosed for layer decoding of multi-level low density parity check encoded data. The apparatus includes a low density parity check decoder operable to perform layered decoding of a plurality of circulant submatrices from an H matrix. The apparatus also includes a parity check calculator connected to the low density parity check decoder, operable to detect whether a stopping criterion has been met in the low density parity check decoder. The low density parity check decoder is also operable to end a decoding operation at less than a maximum number of iterations when the stopping criterion is met.

20 Claims, 5 Drawing Sheets

(56) References Cited

U.S. PATENT DOCUMENTS

| | | | |
|---|---|---|---|
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Vila Casado | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,261,171 B2 | 9/2012 | Annampedu | |
| 8,291,283 B1* | 10/2012 | Rad et al. | 714/752 |
| 8,291,284 B2 | 10/2012 | Savin | |
| 8,291,285 B1* | 10/2012 | Varnica et al. | 714/752 |
| 8,295,001 B2 | 10/2012 | Liu | |
| 2008/0069373 A1 | 3/2008 | Jiang | |
| 2008/0304558 A1 | 12/2008 | Zhu | |
| 2009/0132893 A1 | 5/2009 | Miyazaki | |
| 2009/0185643 A1 | 7/2009 | Fitzpatrick | |
| 2010/0042890 A1 | 2/2010 | Gunnam | |
| 2010/0146361 A1* | 6/2010 | Yuan et al. | 714/752 |
| 2011/0167227 A1 | 7/2011 | Yang | |
| 2011/0252294 A1* | 10/2011 | Ng et al. | 714/804 |
| 2011/0264987 A1 | 10/2011 | Li | |
| 2012/0124118 A1 | 5/2012 | Ivkovic | |
| 2012/0182643 A1 | 7/2012 | Zhang | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kang et al., "A Two-Stage Iterative Decoding of LDPC Codes for Lowering Error Floors", IEEE GLOBECOM Proceedings, 1088-1091 (2008).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Perisa et al "Frequency Offset Estimation Based on Phase Offsets Between Sample Correlations" Dept. of Info. Tech. University of Ulm 2005.

Shokrollahi "LDPC Codes: An Introduction", Digital Fountain, Inc. (Apr. 2, 2003).

Spagnol et al, "Hardware Implementation of GF(2Λm) LDPC Decoders", IEEE Transactions on Circuits and Systemsši: Regular Papers, Vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/174,453, Unpublished (filed Jun. 30, 2011) (Johnson Yen).

U.S. Appl. No. 13/113,219, Unpublished (filed May 23, 2011) (Yang Han).

U.S. Appl. No. 13/174,537, Unpublished (filed Jun. 30, 2011) (Anantha Raman Krishnan).

U.S. Appl. No. 13/171,615, Unpublished (filed Jun. 29, 2011) (Bradley D. Seago).

U.S. Appl. No. 13/180,495, Unpublished (filed Jul. 11, 2011) (Chung-Li Wang).

U.S. Appl. No. 13/213,751, Unpublished (filed Aug. 19, 2011) (Fan Zhang).

U.S. Appl. No. 13/186,234, Unpublished (filed Jul. 19, 2011) (Haitao Xia).

Vasic, B., "High-Rate Girth-Eight Codes on Rectangular Integer Lattices", IEEE Trans. Communications, vol. 52, Aug. 2004, pp. 1248-1252.

Vasic, B., "High-Rate Low-Density Parity-Check Codes Based on Anti-Pasch Affine Geometries," Proc ICC 2002, pp. 1332-1336.

(56) References Cited

OTHER PUBLICATIONS

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Design of VLSI Implementation-Oriented LDPC Codes", IEEE, pp. 670-673, 2003.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong et al., "Joint Code-Encoder Design for LDPC Coding System VLSI Implementation", ISCAS, IEEE pp. 389-392, May 2004.

Zhong et al., "High-Rate Quasi-Cyclic LDPC Codes for Magnetic Recording Channel with Low Error Floor", ISCAS, IEEE pp. 3546-3549, May 2006.

Zhong, "Block-LDPC: A Practical LDPC Coding System Design Approach", IEEE Trans. on Circuits, Regular Papers, vol. 5, No. 4, pp. 766-775, Apr. 2005.

* cited by examiner

MULTI-LEVEL LDPC LAYER DECODER

BACKGROUND

Various embodiments of the present invention are related to methods and apparatuses for decoding data, and more particularly to methods and apparatuses for calculating parity checks when performing layer decoding of multi-level LDPC codes.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

Figure 1:
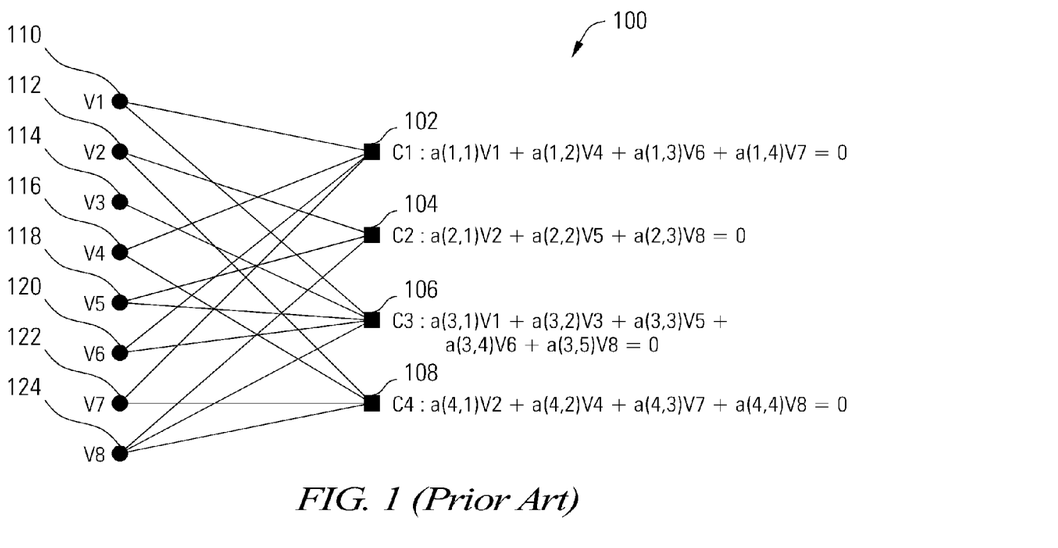
FIG. 1 depicts a Tanner graph of an example prior art LDPC code.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element $\alpha(i,j)$ from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

BRIEF SUMMARY

Various embodiments of the present invention are related to methods and apparatuses for decoding data, and more particularly to methods and apparatuses for calculating parity checks when performing layer decoding of multi-level LDPC codes.

Various embodiments of the present invention provide methods and apparatuses for multi-level layer decoding of non-binary LDPC codes. For example, in one embodiment an apparatus is disclosed for layer decoding of multi-level low density parity check encoded data. The apparatus includes a low density parity check decoder operable to perform layered decoding of a plurality of circulant submatrices from an H matrix. The apparatus also includes a parity check calculator connected to the low density parity check decoder, operable to detect whether a stopping criterion has been met in the low density parity check decoder. The low density parity check decoder is also operable to end a decoding operation at less than a maximum number of iterations when the stopping criterion is met. In some cases, the apparatus is incorporated in a storage device such as one including a storage medium maintaining a data set, and a read/write head assembly operable to sense the data set on the storage medium and to provide an analog output corresponding to the data set, wherein the low density parity check decoder is operable to receive a signal derived from the analog output. In other cases, the apparatus is incorporated in a data transmission device. The low density parity check decoder and the parity check calculator may be embodied in an integrated circuit.

In some instances of the aforementioned embodiment, the parity check calculator includes some or all of the following elements: a parity check calculator, a barrel shifter, a permutation circuit, a parity check calculation circuit, a parity register and a multi-stage adder. The parity check calculator is connected to the low density parity check decoder and is operable to detect whether a stopping criterion has been met in the low density parity check decoder. The low density parity check decoder is operable to end a decoding operation at less than a maximum number of iterations when the stopping criterion is met. The barrel shifter is connected to an input of the parity check calculator and is operable to shift the input from column order to row order. The permutation circuit is connected to the barrel shifter and is operable to arrange non-zero elements in each circulant of an H matrix according to a parity check equation implemented by the parity check calculator. The parity check calculation circuit is connected to the barrel shifter and is operable to implement a parity check equation such as $v \cdot H^T = 0$ over $GF(q)$, where $v \in GF(q)^N$. The parity register is connected to the parity check calculation circuit. The multi-stage adder is connected to the parity register and is operable to add a plurality of parity check results from the parity register to yield an unsatisfied check number and a convergence status.

Other embodiments provide a method of manufacturing a multi-level LDPC layer decoder, including providing a low density parity check decoder operable to iteratively decode a plurality of circulant submatrices from an H matrix in layered fashion, a parity check calculator connected to a soft LLR output from the low density parity check decoder, and a controller connected to the low density parity check decoder and to the parity check calculator. The controller is operable to end a decoding operation in the low density parity check decoder when the parity check calculator detects a stopping criterion. In some instances of the method, the parity check calculator is operable to process a subset of a plurality of layers processed by the low density parity check decoder, wherein the subset of the plurality of layers includes all hard decisions of columns in an H matrix for a low density parity check code associated with the low density parity check decoder.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Various embodiments of the present invention are related to systems and methods for decoding data, and more particularly to methods and apparatuses for calculating parity checks to detect a stopping condition when performing layer decoding of multi-level LDPC codes. The methods and apparatuses for calculating parity checks disclosed herein are applicable to LDPC decoders including, but not limited to, non-binary multi-level LDPC decoders using a Galois field $GF(q)$ with $q=4$ elements, where q may otherwise be a power of any prime number. A multi-level LDPC code of length n is given by the null space over $GF(q)$ of a sparse parity check matrix H over $GF(q)$. LDPC codes are linear block codes. For any linear block code C there exists a k×n matrix G whose row space gives C. Furthermore, there exists an (n−k)×n matrix H such that the n-tuple v is a codeword in C if and only if $v \cdot H^T = 0$. In a multi-level LDPC code, an n-tuple v is a codeword in C if and only if $v \cdot H^T = 0$ over $GF(q)$, where $v \in GF(q)^N$. Therefore, when decoding a multi-level LDPC code, the stopping criterion is if $H \cdot \hat{v} = 0$ over $GF(q)$, where $\hat{v} \in GF(q)^N$, the decoding process is finished with $\hat{v}$ as the decoder output, otherwise, continue the decoding process until the maximum iterations. The implementation of this process is referred to herein as the parity check calculation. A parity check calculator is disclosed herein for use in a multi-level LDPC layer decoder that detects whether the stopping criterion has been met, enabling the multi-level LDPC decoder to perform less than the maximum number of iterations when the data being decoded converges without parity errors.

The methods and apparatuses for calculating parity checks disclosed herein are applicable to LDPC decoders including, but not limited to, quasi-cyclic LDPC codes in which the parity check matrix is an array of circulant submatrices, cyclically shifted versions of identity matrices and null matrices with different cyclical shifts. In some embodiments, the H matrix of a multi-level HDPC code is constructed based on the finite field GF(4) with 12 circulant rows and 108 circulant columns, and with each circulant being a 48×48 submatrix with the form:

$$P_{i,j} = \begin{bmatrix} 0 & \alpha & 0 & \cdots & 0 \\ 0 & 0 & \alpha & \cdots & 0 \\ \vdots & \vdots & \vdots & \ddots & \vdots \\ 0 & 0 & 0 & \cdots & \alpha \\ \alpha & 0 & 0 & \cdots & 0 \end{bmatrix}$$

For example, given the 12×108 H matrix of 48×48 circulants, the overall row length is 108×48 or 5184, and the overall column height is 12×48 or 576. In the multi-level LDPC layer decoder, the parity check matrix of the LDPC code is partitioned into L layers with the H matrix being processed row by row and the circulants being processed layer by layer. As the row is being processed, the column results are updated based on each row result. Layered decoding can reduce the time to converge on a result in the decoder in some cases. The parity check calculator disclosed herein enables layered decoding of multi-level LDPC codes with efficient parity check calculations, even when the parity checks are not covered by a single layer. The parity check calculator also enables decoding to finish before the maximum number of decoding iterations are performed. When the nonzero elements in the last layer or last several layers of the parity check matrix cover the hard decisions of all columns (or symbols), the parity check calculation may be performed for just those last several layers.

Figure 2:
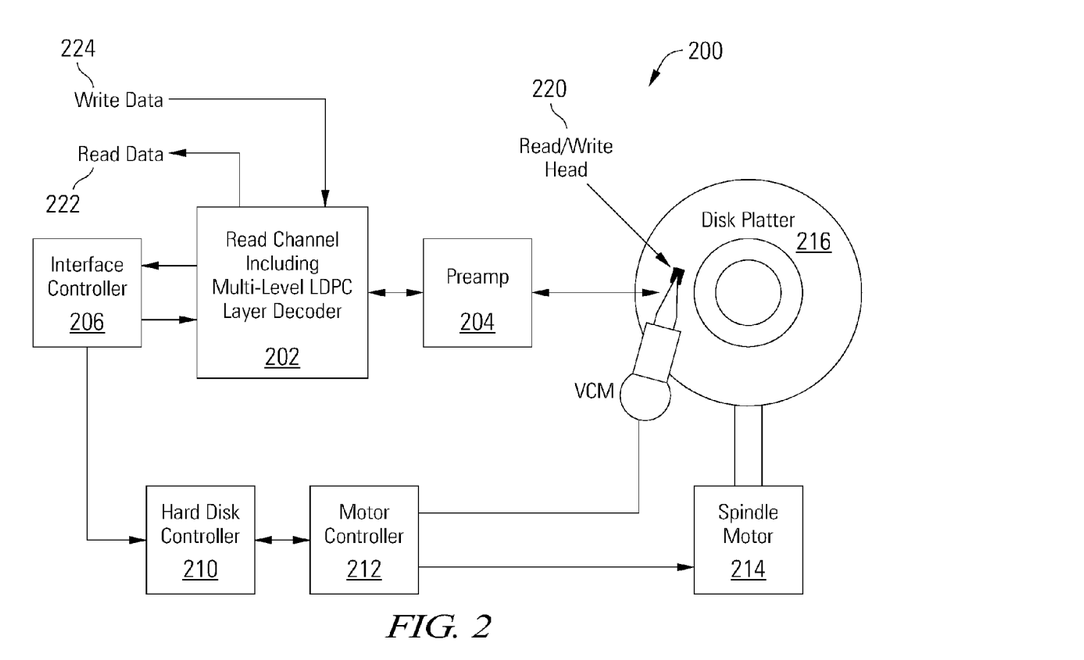
FIG. 2 depicts a storage system including a read channel circuit with a multi-level LDPC layer decoder including a parity check calculator in accordance with some embodiments of the present invention.

Although the multi-level LDPC layer decoder disclosed herein is not limited to any particular application, several examples of applications are presented herein that benefit from embodiments of the present invention. FIG. 2 shows a storage system 200 including a read channel circuit 202 with a multi-level LDPC layer decoder in accordance with some embodiments of the present invention. Storage system 200 may be, for example, a hard disk drive. Storage system 200 also includes a preamplifier 204, an interface controller 206, a hard disk controller 210, a motor controller 212, a spindle motor 214, a disk platter 216, and a read/write head assembly 220. Interface controller 206 controls addressing and timing of data to/from disk platter 216. The data on disk platter 216 consists of groups of magnetic signals that may be detected by read/write head assembly 220 when the assembly is properly positioned over disk platter 216. In one embodiment, disk platter 216 includes magnetic signals recorded in accordance with either a longitudinal or a perpendicular recording scheme.

In a typical read operation, read/write head assembly 220 is accurately positioned by motor controller 212 over a desired data track on disk platter 216. Motor controller 212 both positions read/write head assembly 220 in relation to disk platter 216 and drives spindle motor 214 by moving read/write head assembly 220 to the proper data track on disk platter 216 under the direction of hard disk controller 210. Spindle motor 214 spins disk platter 216 at a determined spin rate (RPMs). Once read/write head assembly 220 is positioned adjacent the proper data track, magnetic signals representing data on disk platter 216 are sensed by read/write head assembly 220 as disk platter 216 is rotated by spindle motor 214. The sensed magnetic signals are provided as a continuous, minute analog signal representative of the magnetic data on disk platter 216. This minute analog signal is transferred from read/write head assembly 220 to read channel circuit 202 via preamplifier 204. Preamplifier 204 is operable to amplify the minute analog signals accessed from disk platter 216. In turn, read channel circuit 202 decodes and digitizes the received analog signal to recreate the information originally written to disk platter 216. This data is provided as read data 222 to a receiving circuit. As part of decoding the received information, read channel circuit 202 processes the received signal using a multi-level LDPC layer decoder. Such a multi-level LDPC layer decoder may be implemented consistent with that described below in relation to FIGS. 4-6. In some cases, the multi-level LDPC layer decoding may be done consistent with the flow diagram discussed below in relation to FIG. 7. A write operation is substantially the opposite of the preceding read operation with write data 224 being provided to read channel circuit 202. This data is then encoded and written to disk platter 216.

It should be noted that storage system 200 may be integrated into a larger storage system such as, for example, a RAID (redundant array of inexpensive disks or redundant array of independent disks) based storage system. It should also be noted that various functions or blocks of storage system 200 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

Figure 3:
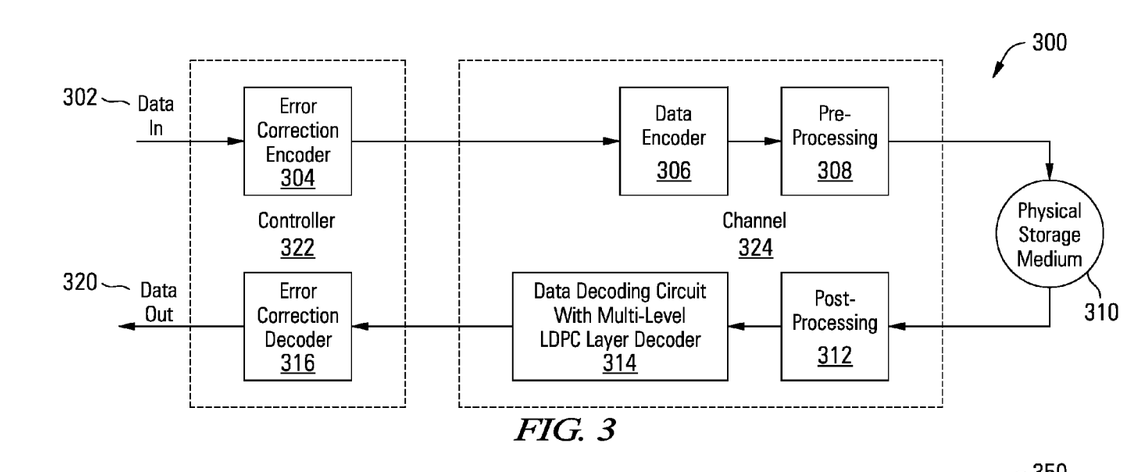
FIG. 3 depicts an example data storage system using a data decoder with a multi-level LDPC layer decoder including a parity check calculator in accordance with some embodiments of the present invention.

Turning to FIG. 3, a storage system 300 including a data decoding circuit 314 with a multi-level LDPC layer decoder is shown in accordance with some embodiments of the present invention. Storage system 300 includes a controller 322, a channel 324, and a physical storage medium 310. Physical storage medium 310 may be, but is not limited to, a magnetic disk. Based on the disclosure provided herein, one of ordinary skill in the art will recognize a variety of physical storage media that may be used in relation to different embodiments of the present invention. Controller 322 includes error correction encoding and decoding. In particular, controller 322 includes an error correction encoder 304. Error correction encoder 304 may be any error correction encoder known in the art including, but not limited to, a Reed Solomon encoder or a CRC encoder, and error correction decoder 316 may be, but is not limited to, a corresponding Reed Solomon decoder or CRC decoder. Both the aforementioned encoder and decoder may be any circuit or system known in the art that is capable of performing encoding and decoding processes. Channel 324 includes a data encoder 306 and a pre-processing circuit 308. In some cases, data encoder 306 is an LDPC encoder. Based on the disclosure provided herein, one of ordinary skill in the art will recognize a variety of encoding processes and corresponding decoding processes that may be implemented in accordance with different embodiments of the present invention. Pre-processing circuit 308 includes the various pre-processing circuitry that is well known in the art. Post-processing circuit 312 includes the various post-processing circuitry that is well known in the art for receiving data from a physical storage medium and for preparing the received data for data detection and decoding.

During operation of the storage system 300, a data input 302 is received. Data input 302 may be any data set destined for storage on physical storage medium 310. Data input 302 is encoded using error correction encoder 304 as is known in the art. The output of error correction encoder 304 is provided to data encoder 306 that may, for example, perform an LDPC encoding of the data. The output of data encoder 306 is provided to pre-processing circuit 308 that may convert the output from a digital output to an analog output satisfactory for writing to physical storage medium 310.

The data previously written to physical storage medium 310 may be subsequently retrieved and processed by post-processing circuit 312. In one case, post-processing circuit 312 performs an amplification of an analog data signal retrieved from physical storage medium 310, and converts the amplified analog signal to a digital signal that is output to data decoding circuit 314. In turn, data decoding circuit 314 performs a variable number of data detection and data decoding processes until either the output of the processes converges (i.e., it adequately represents the original data encoded by data encoder 306) or until insufficient resources remain to perform additional processing. Data decoding circuit 314 provides its result as an output to error correction decoder 316. Error correction decoder 316 performs the designated error correction processing to determine whether any errors remain and if detected, attempts to correct the errors. Once the error correction processes are completed, error correction decoder 316 provides a data output 320. In general, data output 320 corresponds to data input 302 that was originally provided for writing to physical storage medium 310.

The data decoding circuit 314 includes a multi-level LDPC layer decoder capable of decoding data with low latency when compared with conventional non-binary multi-level LDPC decoders.

Figure 4:
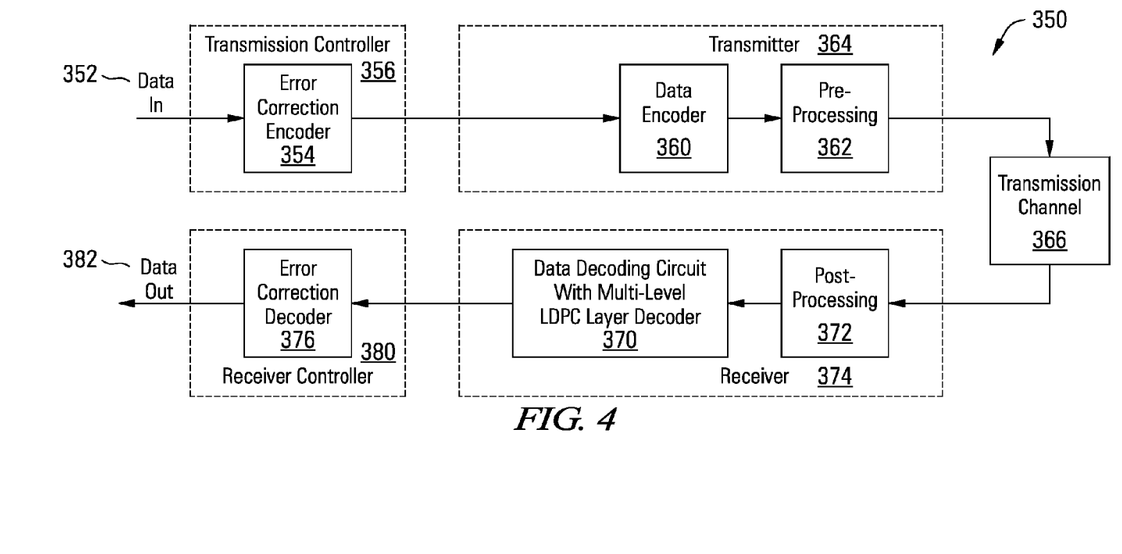
FIG. 4 depicts an example data transfer system using a data decoder with a multi-level LDPC layer decoder including a parity check calculator in accordance with some embodiments of the present invention.

Turning to FIG. 4, a transmission system 350 including a data decoding circuit 370 with a multi-level LDPC layer decoder is depicted in accordance with some embodiments of the present invention. Transmission system 350 includes a transmission controller 356, a transmitter 364, a transmission channel 366, a receiver 374, and a receiver controller 380. Transmission channel may be, but is not limited to, an RF transmission channel. Based on the disclosure provided herein, one of ordinary skill in the art will recognize a variety of transmission channels that may be used in relation to different embodiments of the present invention. Transmission controller 356 includes an error correction encoder 354 that may be implemented, for example, as a Reed Solomon encoder or a CRC encoder. Similarly, receiver controller 380 includes an error correction decoder 376 corresponding to error correction encoder 354. Thus, error correction decoder 376 may be, for example, a CRC decoder or a Reed Solomon decoder. Both the aforementioned encoder and decoder may be any circuit or system known in the art that is capable of performing encoding and decoding processes. Based on the disclosure provided herein, one of ordinary skill in the art will recognize a variety of error correction encoder/decoder approaches that may be used in relation to different embodiments of the present invention.

Transmitter 364 includes a data encoder 360 and a pre-processing circuit 362. In some cases, data encoder 360 is an LDPC encoder. Based on the disclosure provided herein, one of ordinary skill in the art will recognize a variety of encoding processes that may be implemented in accordance with different embodiments of the present invention. Pre-processing circuit 362 includes the various pre-processing circuitry that is well known in the art. In one particular case, pre-processing circuit 362 is operable to convert a digital data set from data encoder 360 to a corresponding RF signal suitable for transmission via transmission channel 366. The data set transferred via transmission channel 366 is received using a post-processing circuit 372 of receiver 374. Post-processing circuit 372 includes the various post-processing circuitry that is well known in the art for receiving data from a transmission channel and for preparing the received data for data detection and decoding.

In operation, a data input 352 is received. Data input 352 may be any data set destined for transmission via transmission channel 366. Data input 352 is encoded using error correction encoder 354 as is known in the art. The output of error correction encoder 354 is provided to data encoder 360 that may, for example, perform an LDPC encoding of the data. The output of data encoder 360 is provided to pre-processing circuit 362 that may convert the output from a digital output to an analog output satisfactory for transmission via transmission channel 366.

The data transmitted via transmission channel 366 is received and processed by post-processing circuit 372 of receiver 374. In one case, post-processing circuit 372 performs an amplification of an analog data signal retrieved from transmission channel 366, and converts the amplified analog signal to a digital signal that is output to data decoding circuit 370. In turn, data decoding circuit 370 performs a variable number of data detection and data decoding processes until either the output of the processes converges (i.e., it adequately represents the original data encoded by data encoder 360) or until insufficient resources remain to perform additional processing. Data decoding circuit 370 provides its result as an output to error correction decoder 376. Error correction decoder 376 performs the designated error correction processing to determine whether any errors remain and if detected, attempts to correct the errors. Once the error correction processes are completed, error correction decoder 376 provides a data output 382. In general, data output 382 corresponds to data input 352 that was originally provided for transmission via transmission channel 366.

As in the storage system 300 of FIG. 3B, the data decoding circuit 370 of transmission system 350 includes a multi-level LDPC layer decoder capable of decoding data with low latency when compared with conventional non-binary multi-level LDPC decoders.

It should be noted that while FIGS. 2, 3A and 3B depict storage systems and a transmission system in which a multi-level LDPC layer decoder may be applied, there are a variety of systems in which a multi-level LDPC layer decoder in accordance with different embodiments of the present invention may be applied. Based on the disclosure provided herein, one of ordinary skill in the art will recognize a variety of systems that may be benefited by use of a multi-level LDPC layer decoder in accordance with different embodiments of the present invention.

Figure 5:
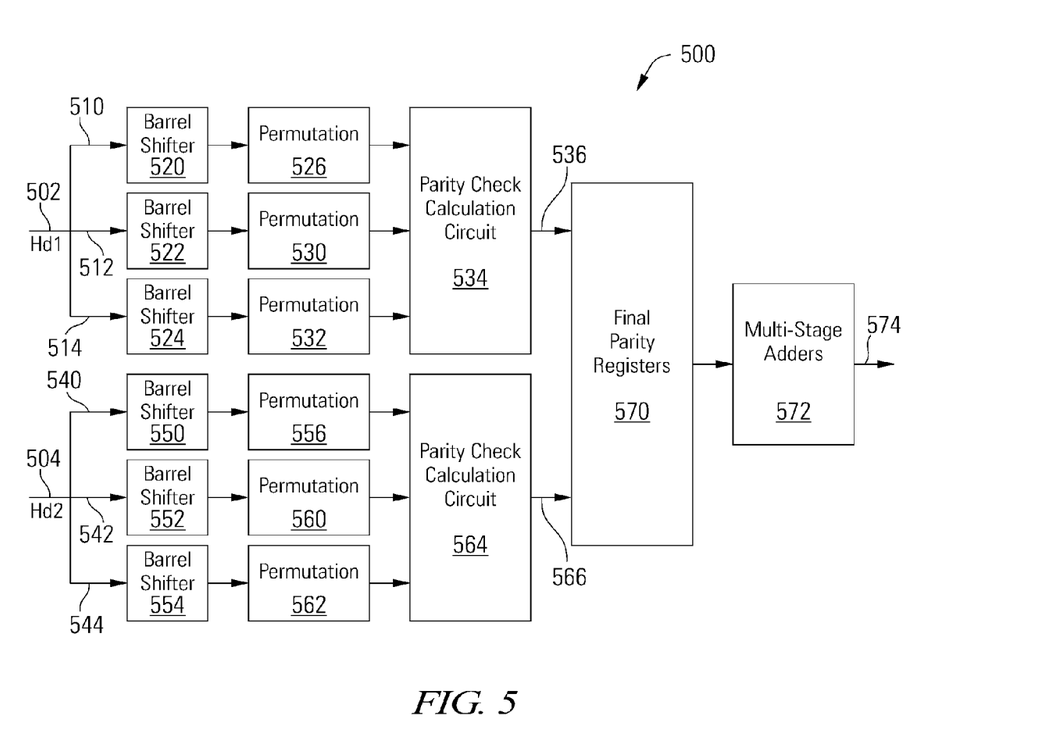
FIG. 5 depicts a block diagram of a parity check calculator for use in detecting a stopping condition in a multi-level non-binary LDPC layer decoder in accordance with various embodiments of the present invention.

Turning to FIG. 5, a block diagram of a parity check calculator 500 is illustrated that may be used to detect a stopping criterion during layer decoding in a multi-level non-binary LDPC decoder. In some embodiments, the multi-level LDPC layer decoder is adapted to check the parity of just the last several layers, for example the last two or three layers, of the parity check matrix, when the last several layers cover the hard decisions of all columns (or symbols). In other embodiments, the parity check calculator 500 is adapted to check the parity of all layers as they are decoded.

The parity check calculator 500 takes as input hard decisions 502 and 504 (HD1 and HD2) generated by variable nodes for two circulants being processed in parallel. In this example embodiment, each column in the circulant being processed has three non-zero elements, thus the hard decision 502 comprises three hard decision inputs 510, 512, 514 which are processed in parallel to further reduce latency. In other embodiments, the three hard decision inputs 510, 512, 514 are processed serially.

The three hard decision inputs 510, 512, 514 are received in column order from check nodes, whereas the parity check calculation is performed in row order as layers are decoded. The inputs to the parity check calculator 500 from a multi-level LDPC layer decoder are a total soft value in column order, including the sign and LLR values. The three hard decision inputs 510, 512, 514 are therefore each processed by a barrel shifter 520, 522, 524 which extracts the sign from the soft values and shifts the remaining LLR values from column order to row order to prepare for the parity check calculation. The outputs of the barrel shifters 520, 522, 524 are provided to permutation circuits 526, 530, 532. Because the non-zero elements in each circulant of the H matrix for a non-binary LDPC code are not limited to the value 1 but also may have the value $\alpha$ and $\alpha^2$, the components to be XORed in the parity check calculation are adjusted or rearranged in the permutation circuits 526, 530, 532 based on the parity check equation so that coefficients are in the proper location. The parity check calculation is performed in a parity check calculation circuit 534. The parity check calculation circuit 534 includes multiplexers and XOR circuits to generate the parity check value 536, implementing the parity check equation $v \cdot H^T = 0$ over GF(q), where $v \in GF(q)^N$. Each column has three non-zero circulants in the H matrix, and the parity check calculations are performed in parallel for these three circulants, so the multiplexers are used to select the proper row for the non-zero circulant. The XOR circuits are sequential circuits that XOR all the inputs in each clock cycle until the last non-zero circulant in a row has been processed.

Again, two circulants are processed in parallel during the layer decoding. The second hard decision 504 comprises three hard decision inputs 540, 542, 544 which are processed in parallel to further reduce latency. In other embodiments, the three hard decision inputs 540, 542, 544 are processed serially.

The three hard decision inputs 540, 542, 544 are received in column order from check nodes and are therefore each processed by a barrel shifter 550, 552, 554 which shifts the hard decisions 540, 542, 544 from column order to row order to prepare for the parity check calculation. The outputs of the barrel shifters 550, 552, 554 are provided to permutation circuits 556, 560, 562, which rearrange them based on the parity check equation. The parity check calculation is performed in a parity check calculation circuit 564. The parity check calculation circuit 564 includes multiplexers and XOR circuits to generate the parity check value 566, implementing the parity check equation $v \cdot H^T = 0$ over GF(q), where $v \in GF(q)^N$. Each column has three non-zero circulants in the H matrix, and the parity check calculations are performed in parallel for these three circulants, so the multiplexers are used to select the proper row for the non-zero circulant. The XOR circuits are sequential circuits that XOR all the inputs in each clock cycle until the last non-zero circulant in a row has been processed.

The parity check values 536 and 566 (also referred to as the final values of the syndrome) are stored in final parity registers 570. Multi-stage adders 572 sum all the syndromes together to obtain the unsatisfied check number and convergence status 574. If the unsatisfied check number is equal to zero after all layers have been processed, the multi-level LDPC layer decoder has converged. Otherwise, if the unsatisfied check number is not equal to zero after any iteration, the decoder has not converged.

Figure 6:
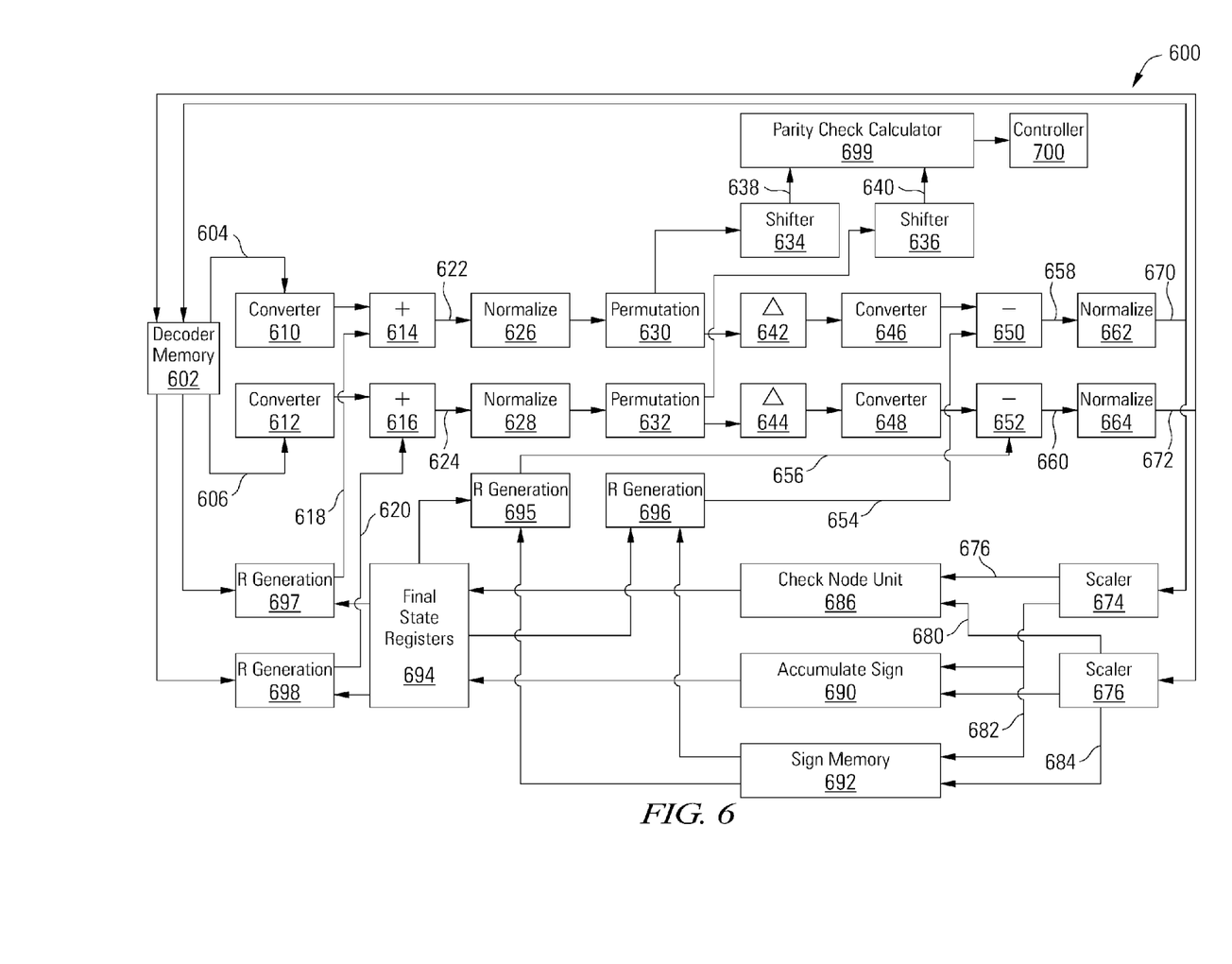
FIG. 6 depicts a block diagram of a multi-level non-binary LDPC layer decoder in which a stopping condition can be detected by a parity check calculator in accordance with various embodiments of the present invention.

Turning to FIG. 6, a block diagram of the hardware architecture of a multi-level non-binary LDPC layer decoder 600 in which a stopping condition can be detected by a parity check calculator in illustrated accordance with various embodiments of the present invention. In this embodiment, two circulants are processed in parallel. A decoder memory 602 stores soft LLR input values, Q values, and soft LLR output P values. The decoder memory 602 is a ping pong memory, consisting in some embodiments of 16 banks with each bank having size 54×264. The decoder memory 602 provides Q values 604 and 606 of the connected layer of the variable node to converters 610 and 612, respectively, each based on a different circulant being processed. In a GF(4) embodiment, the Q values 604 and 606 each consist of one hard decision and three soft LLR values.

The converters 610 and 612 convert the Q values from a format containing a hard decision and three soft LLR values to a format containing four soft LLR values, with the information being equivalent in the two formats. Adders 614 and 616 add the connected layer's Q value (converted by converters 610 and 612) to the connected layer's R value 618 and 620 of each symbol of a circulant respectively, yielding the soft LLR values 622 and 624 of each symbol. In an embodiment with GF(4), each adder 614 and 616 consists of four adders each, adapted to add the connected layer's Q value with the connected layer's R value of each symbol of a circulant respectively to obtain the soft LLR values 622 and 624 of each symbol.

The soft LLR values 622 and 624 of each symbol are provided to normalizers 626 and 628, which compare the four values in each of the soft LLR values 622 and 624 to identify the minimum of each, and which subtract that minimum from the other three soft LLR values, thereby normalizing each of the soft LLR values 622 and 624 to their respective minimum.

The normalized variable node LLR values from normalizers 626 and 628 are provided to permutation circuits 630 and 632, which rearrange the variable node updated values to prepare for the check node update and apply the permutations specified by the non-zero elements of the H matrix. In a GF(4) embodiment, the four elements 0-3 of the Galois Field are 0, 1, $\alpha$, $\alpha^2$. The permutation applied by permutation circuits 630 and 632 is multiplication in the Galois Field. Element 2($\alpha$) multiplied by element 1 (1) equals $\alpha \times 1$ or $\alpha$, which is element 2. Similarly, element $2 \times 2 = \alpha \times \alpha = \alpha^2$, which is element 3. Element $2 \times 3 = \alpha \times \alpha^2 = 1$, which is element 1. Thus, element 2 multiplied by 1, 2 and 3 results in elements 2, 3, and 1, which are permutations of elements 1, 2 and 3. In the parity check calculation, each hard decision value is multiplied by the non-zero elements (1, 2, or 3) of the H matrix, and the results are XORed together.

Shifters 634 and 636 process the output of permutation circuits 630 and 632 to shift the soft LLR values back to column order to yield soft LLR outputs 638 and 640 as the hard decisions used by the parity check calculator (e.g., hard decisions 502 and 504 used by parity check calculator 500). Shifters 634 and 636 are used to shift from row order to column order because the multi-level LDPC layer decoder 600 processes data in row order, but the output total soft LLR is ordered by column in order to subtract the input LLR which is in column order to get the extrinsic LLR value. Delta shifters 642 and 644 also process the output of permutation circuits 630 and 632, shifting the output of the permutation circuits 630 and 632 by the difference in the circulant shift numbers of the current layer and the connected layer. In a given column there are circulants with different shift numbers, and the delta shifters 642 and 644 compensate for the different shift numbers of the current layer and the connected layer.

The output of delta shifters 642 and 644 is provided to converters 646 and 648 which convert from the format containing one hard decision and three soft LLR values back to the format containing four soft LLR values. Subtractors 650 and 652 then subtract the R values 654 and 656 of the symbols of the current layer from the soft LLR P values provided by converters 646 and 648 to obtain Q values 658 and 660 of the symbols of the current layer. The Q values 658 and 660 of the symbols of the current layer are then normalized in normalizers 662 and 664, which compare the four values in each of the Q values 658 and 660 to identify the minimum of each, and which subtract that minimum from the other three elements of the Q values 658 and 660, thereby normalizing each of the Q values 658 and 660 to their respective minimum. The normalized Q values 670 and 672 are provided to the decoder memory 602 to update the Q values of the current layers, and also to scalers 674 and 676 to obtain the new Q values to perform the check node to variable node update.

Scalers 674 and 676 scale the normalized Q values 670 and 672 from the normalizers 662 and 664, yielding the new Q values 678 and 680, or absolute soft values, along with the Q values signs 682 and 684. The new Q values 678 and 680 and their signs 682 and 684 are provided to the check node unit 686 which finds the minimum value, second or next minimum value and the index of the minimum value. The new Q values signs 682 and 684 are also provided to a sign accumulator 690, which calculates and stores the cumulative sign for the current layer of the Q values 678 and 680, and to a sign memory 692 which stores the sign value of each non-zero element of the H matrix.

Final state registers 694 store the final state consisting of the minimum value, the second minimum value, the index of the minimum value, and cumulative sign of the current layer. These final state values are provided to two sets of R generators 695, 696, 697 and 698, which generate the R value for the connected layer or current layer based on the final state and current column index of the symbol. R generators 695 and 696 generate the R values for the current layer of the two circulants being processed, and R generators 697 and 698 generate the R values for the connected layer of the two circulants being processed. If the current column index is equal to the index of the minimum value, then the value of R is the second minimum value. Otherwise, the value of R is the minimum value of that layer. The sign of R is the XOR of the cumulative sign and the current sign of the symbol.

During operation of the multi-level LDPC layer decoder 600, as Q values and R values are iteratively circulated through the decoder 600, at least during processing of the layers in which the nonzero elements of the parity check matrix cover the hard decisions of all columns (or symbols), a parity check calculator 699 calculates parity as described with respect to FIG. 5, based on soft LLR outputs 638 and 640. If the unsatisfied check number calculated by the parity check calculator 699 is equal to zero after all layers have been processed, the multi-level LDPC layer decoder 600 has converged and processing can be halted. Otherwise, if the unsatisfied check number is not equal to zero after any iteration, the decoder 600 has not converged and processing continues until convergence or until the maximum number of iterations is reached.

A controller 700 in the multi-level LDPC layer decoder 600 is provided in some embodiments to control the decoding process, monitoring the convergence status and controlling the iterations, and halting the decoding process when the maximum number of iterations has been reached or when the data converges without parity errors as determined by the parity check calculator 699.

Figure 7:
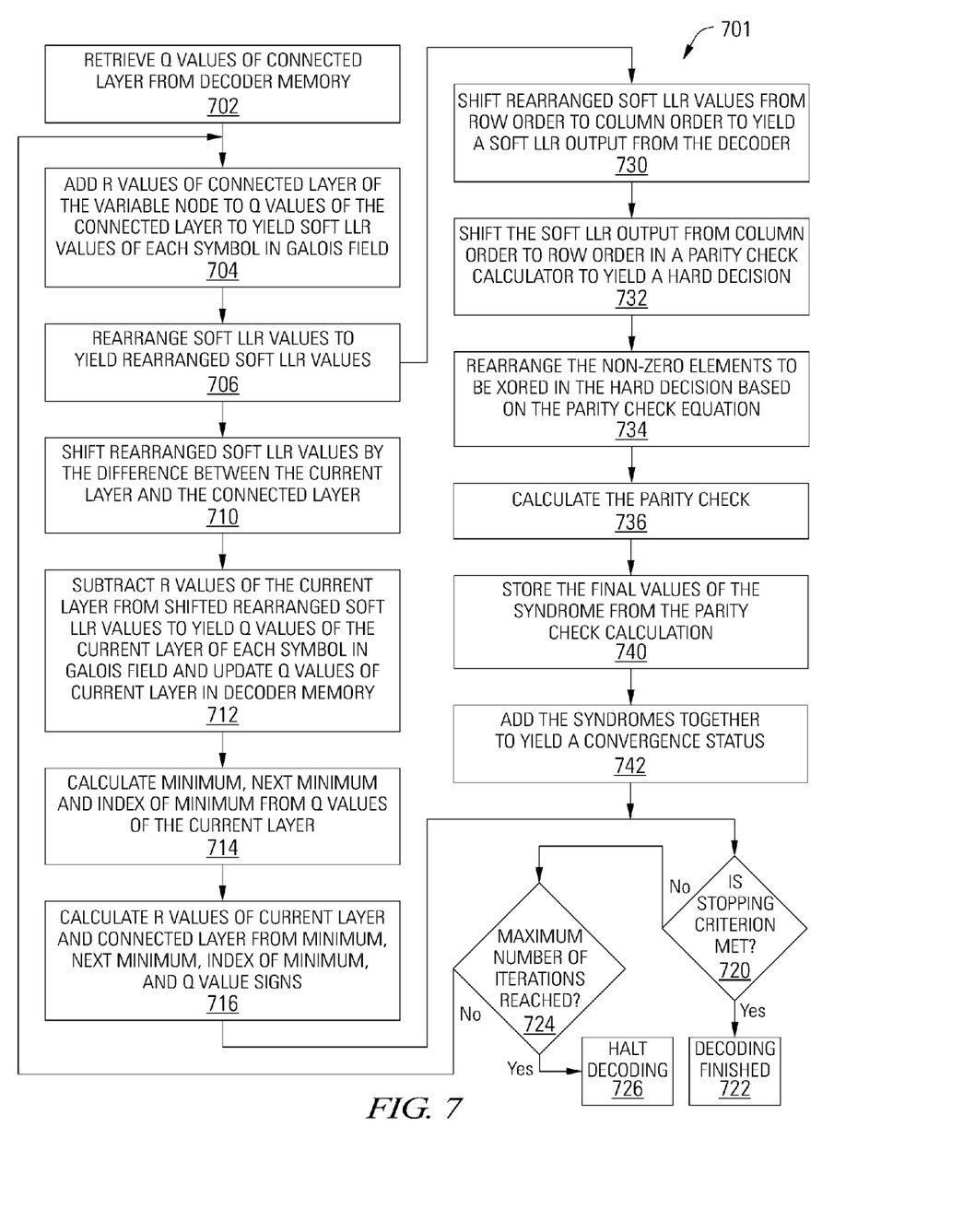
FIG. 7 depicts a flow diagram showing a method for multi-level LDPC layer decoding in accordance with various embodiments of the present invention.

Turning to FIG. 7, a flow diagram 701 depicts a method for multi-level LDPC layer decoding in accordance with various embodiments of the present invention. The method of FIG. 7, or variations thereof, may be performed in data decoding circuits such as those illustrated in FIGS. 2-6. Following flow diagram 701, the Q values of the connected layer of the H matrix are retrieved from the decoder memory. (Block 702) R values of the connected layer of the variable node are added to Q values of the connected layer to yield soft LLR values of each symbol in Galois Field. (Block 704) The soft LLR values are rearranged to yield rearranged soft LLR values. (Block 706) The rearranged soft LLR values are shifted by the difference between the current layer and the connected layer. (Block 710) R values of the current layer are subtracted from the shifted rearranged soft LLR values to yield Q values of the current layer of each symbol in Galois Field, and Q values of current layer are updated in the decoder memory. (Block 712) The minimum, next minimum and index of minimum are calculated from Q values of the current layer. (Block 714) R values of the current layer and the connected layer are calculated from the minimum, next minimum, index of minimum, and Q value signs. (Block 716) If the current column index is equal to the index of the minimum value, then the value of R is the second minimum value. Otherwise, the value of R is the minimum value of that layer. The sign of R is the XOR of the cumulative sign and the current sign of the symbol.

A determination is made as to whether the stopping criterion has been met. (Block 720) The stopping criterion conditions are calculated by a parity check calculation, illustrated in blocks 730-742. If the stopping criterion has been met, the decoding is finished. (Block 722) If the stopping criterion has not been met, a determination is made as to whether the maximum number of iterations has been reached in the decoder. (Block 724) If so, decoding is halted without converging. (Block 726) If not, decoding continues at block 704.

While iterations of the steps in blocks 704-716 are being performed, a parity check calculator in the LDPC decoder checks during the decoding process for a stopping criterion. As discussed above, the parity check calculation may be performed for all layers during the decoding process, or just the last several layers if those last several layers cover the hard decisions of all columns (or symbols). The parity check calculation is illustrated in blocks 730-742, determining whether data has converged before the maximum number of iterations has been reached. The rearranged soft LLR values produced in block 706 are shifted from row order to column order to yield a total soft LLR output from the decoder. (Block 730) The total soft LLR value may be used to generate the extrinsic value as the output by subtracting the input value. The total soft LLR value also contains a sign value which is used as the hard decision value to be used in the parity check calculator. The soft LLR output is shifted from column order to row order in a parity check calculator to yield a hard decision. (Block 732) The non-zero elements to be XORed in the hard decision are rearranged based on the parity check equation. (Block 734) Because the non-zero elements in each circulant of the H matrix are not only 1 but also $\alpha$ and $\alpha^2$, the components which should be XORed are rearranged based on the parity check equation. The parity check is calculated based on the rearranged soft LLR output from the decoder. (Block 736) In some embodiments, the parity check implements the parity check equation $v \cdot H^T = 0$ over $GF(q)$, where $v \in GF(q)^N$. The final values of the syndrome from the parity check calculation are stored, for example in a register. (Block 740) The syndromes are added together to yield a convergence status. (Block 742) In some embodiments, the unsatisfied check number is also calculated. Thus, while decoding a multi-level LDPC code as illustrated in blocks 704-716, a parity check calculation is also determining whether a stopping criterion is met. In some embodiments, the stopping criterion is if $H \cdot \hat{v} = 0$ over $GF(q)$, where $\hat{v} \in GF(q)^N$, the decoding process is finished with $\hat{v}$ as the decoder output.

Notably, the operations illustrated in the flowchart of FIG. 7 do not necessarily have to be performed in the order shown in the flowchart, and some operations can be performed in parallel. Furthermore, the operations illustrated in FIG. 7 are not exclusive and additional operations may be included in some embodiments of a method to decode for multi-level LDPC layer decoding. For example, in some embodiments, variable node operations are performed on messages containing only LLR data, while check node operations are performed on messages containing a hard decision and normalized LLR data. In these embodiments, the method may also include operations for converting between the two message formats as messages are passed between variable node processors and check node processors.

In conclusion, the present invention provides novel methods and apparatuses for multi-level non-binary LDPC layer decoding, including parity checking during layer decoding to monitor for stopping conditions to reduce latency. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for layer decoding of multi-level low density parity check encoded data comprising:
   a low density parity check decoder operable to perform layered decoding of a plurality of circulant submatrices from an H matrix; and
   a parity check calculator connected to the low density parity check decoder, operable to detect whether a stopping criterion has been met in the low density parity check decoder, the low density parity check decoder being operable to end a decoding operation at less than a maximum number of iterations when the stopping criterion is met.

2. The apparatus of claim 1, wherein the stopping criterion is met when $H \cdot \hat{v} = 0$ over $GF(q)$, where $\hat{v} \in GE(q)^N$, with $\hat{v}$ comprising an output of the low density parity check decoder, and where H comprises the H matrix and $GF(q)$ comprises a Galois Field associated with the low density parity check decoder.

3. The apparatus of claim 1, further comprising a controller connected to the low density parity check decoder and to the parity check calculator, the controller being operable to control iterations in the low density parity check decoder and to cause the low density parity check decoder to end the decoding operation when the stopping criterion is met.

4. The apparatus of claim 1, wherein the parity check calculator comprises a barrel shifter connected to an input of the parity check calculator, the barrel shifter being operable to shift the input from column order to row order.

5. The apparatus of claim 4, wherein the parity check calculator further comprises a permutation circuit connected to the barrel shifter and operable to arrange non-zero elements in each circulant of the H matrix according to a parity check equation implemented by the parity check calculator.

6. The apparatus of claim 5, wherein the parity check calculator further comprises a parity check calculation circuit connected to the barrel shifter and operable to implement the parity check equation, wherein the parity check equation comprises $H \cdot \hat{v}$ over $GF(q)$, where $\hat{v} \in GF(q)^N$, with $\hat{v}$ comprising an output of the low density parity check decoder, and where H comprises the H matrix and $GF(q)$ comprises a Galois Field associated with the low density parity check decoder.

7. The apparatus of claim 6, wherein the parity check calculator further comprises a parity register connected to the parity check calculation circuit.

8. The apparatus of claim 7, wherein the parity check calculator further comprises a multi-stage adder connected to the parity register and operable to add a plurality of parity check results from the parity register to yield an unsatisfied check number and a convergence status.

9. The apparatus of claim 1, wherein the parity check calculator is operable to process a plurality of inputs in parallel, with an input for each H matrix column having a non-zero entry.

10. The apparatus of claim 1, wherein the parity check calculator is operable to process a plurality of circulants in parallel.

11. The apparatus of claim 1, wherein the low density parity check decoder is operable to process values from a current layer and from a connected layer.

12. The apparatus of claim 1, wherein the low density parity check decoder is operable to calculate R values by identifying a minimum, a next minimum and an index of the minimum for soft log-likelihood-ratio values.

13. The apparatus of claim 1, wherein the low density parity check decoder and the parity check calculator are implemented as an integrated circuit.

14. The apparatus of claim 1, wherein the apparatus is incorporated in a storage device.

15. The apparatus of claim 14, wherein the storage device comprises:
   a storage medium maintaining a data set; and
   a read/write head assembly operable to sense the data set on the storage medium and to provide an analog output corresponding to the data set, wherein the low density parity check decoder is operable to receive a signal derived from the analog output.

16. The apparatus of claim 1, wherein the apparatus is incorporated in a data transmission device.

17. A method of manufacturing a multi-level low density parity check layer decoder, comprising:
- providing a low density parity check decoder operable to iteratively decode a plurality of circulant submatrices from an H matrix in layered fashion;
- providing a parity check calculator connected to a soft log-likelihood-ratio output from the low density parity check decoder; and
- providing a controller connected to the low density parity check decoder and to the parity check calculator, wherein the controller is operable to end a decoding operation in the low density parity check decoder when the parity check calculator detects a stopping criterion.

18. The method of claim 17, wherein the parity check calculator is operable to process a subset of a plurality of layers processed by the low density parity check decoder, wherein the subset of the plurality of layers includes all hard decisions of columns in the H matrix for a low density parity check code associated with the low density parity check decoder.

19. The method of claim 17, wherein the low density parity check decoder is operable to process non-binary log-likelihood-ratio values.

20. An apparatus for decoding of non-binary multi-level low density parity check encoded data, comprising:
- a low density parity check decoder operable to perform layered decoding of a plurality of circulant submatrices from an H matrix;
- a parity check calculator connected to the low density parity check decoder, operable to detect whether a stopping criterion has been met in the low density parity check decoder, the low density parity check decoder being operable to end a decoding operation at less than a maximum number of iterations when the stopping criterion is met, wherein the parity check calculator comprises:
- a barrel shifter connected to an input of the parity check calculator, the barrel shifter being operable to shift the input from column order to row order;
- a permutation circuit connected to the barrel shifter and operable to arrange non-zero elements in each circulant of the H matrix according to a parity check equation implemented by the parity check calculator;
- a parity check calculation circuit connected to the barrel shifter and operable to implement the parity check equation;
- a parity register connected to the parity check calculation circuit; and
- a multi-stage adder connected to the parity register and operable to add a plurality of parity check results from the parity register to yield an unsatisfied check number and a convergence status.

* * * * *